(12) United States Patent
Takada

(10) Patent No.: US 12,164,856 B2
(45) Date of Patent: Dec. 10, 2024

(54) TOPOLOGICAL SIMULATION OF LAYOUT DESIGN

(71) Applicant: MICRON TECHNOLOGY, INC., Boise, ID (US)

(72) Inventor: Yorio Takada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 565 days.

(21) Appl. No.: 17/541,133

(22) Filed: Dec. 2, 2021

(65) Prior Publication Data
US 2023/0177248 A1    Jun. 8, 2023

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC ........ G06F 30/39; G06F 30/33; G06F 30/394; G06F 30/3308; G06F 30/398; G06F 30/392; G06F 16/25
USPC ......................................................... 716/111
See application file for complete search history.

(56) References Cited

U.S. PATENT DOCUMENTS

| | | | |
|---|---|---|---|
| 8,789,005 B1 * | 7/2014 | Umino ................... | G06F 30/39 716/135 |
| 2005/0172248 A1 * | 8/2005 | Shimada .............. | G06F 30/398 716/52 |

* cited by examiner

*Primary Examiner* — Paul Dinh
(74) *Attorney, Agent, or Firm* — Dorsey & Whitney LLP

(57) ABSTRACT

Apparatuses, computer implemented methods and non-transitory computer-readable media storing instructions to implement simulating topological features of layout designs are disclosed. An example method includes: receiving information about the layout design including topological parameters in a verification area; defining a width and a length in first and second direction directions of one or more windows; defining first and second step sizes independently from the width and the length in the first and second directions for the one or more windows, the first step size being a distance between adjacent central points of the one or more windows in the first direction and the second step size being a distance between adjacent central points of the one or more windows in the second direction; extracting information about the layout design in the one or more windows at each of a plurality of window locations; and storing the information in a database.

34 Claims, 6 Drawing Sheets

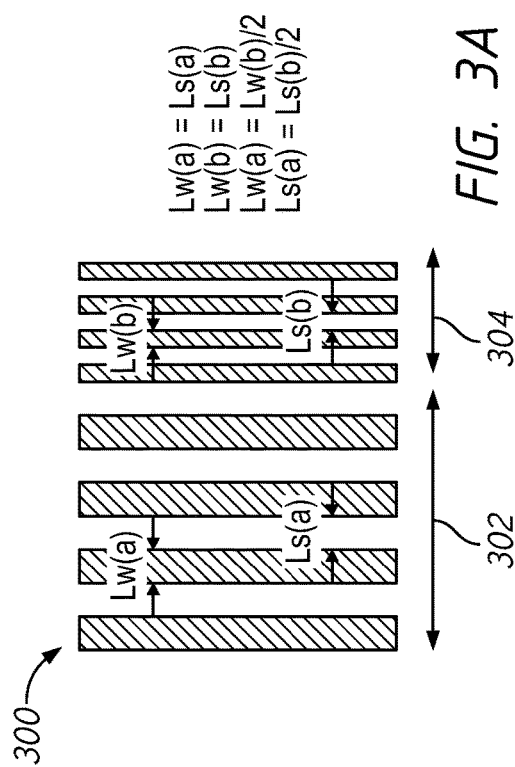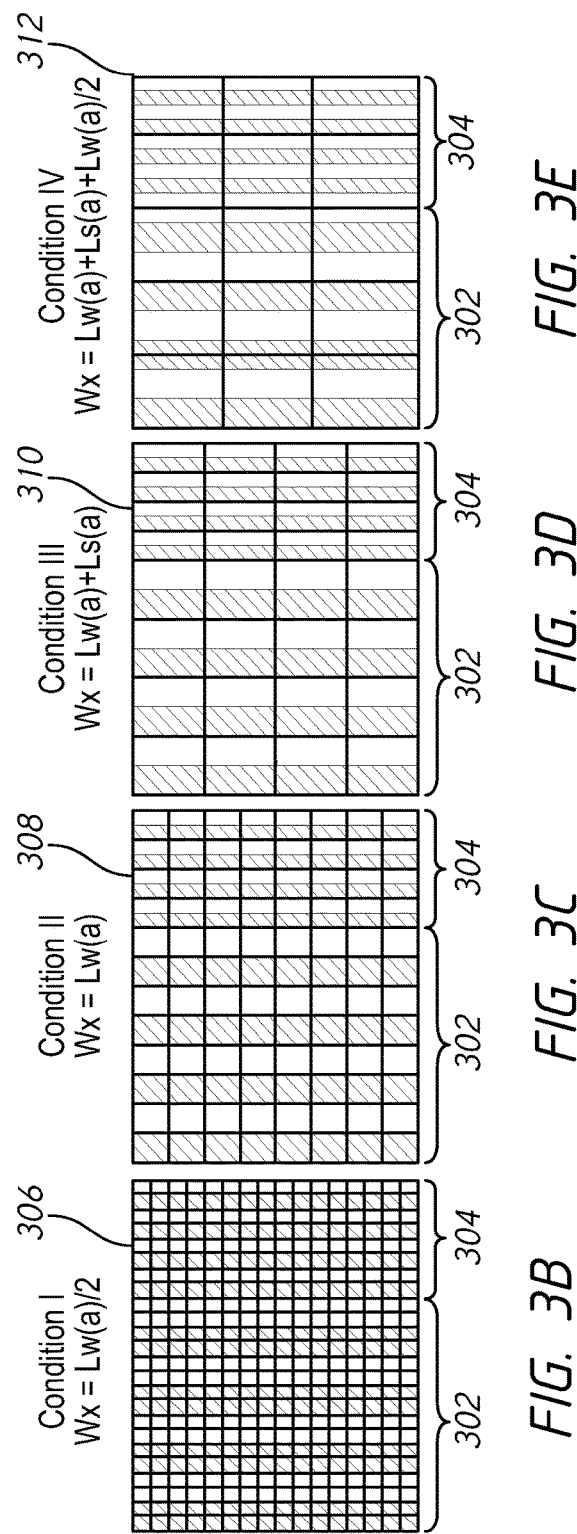

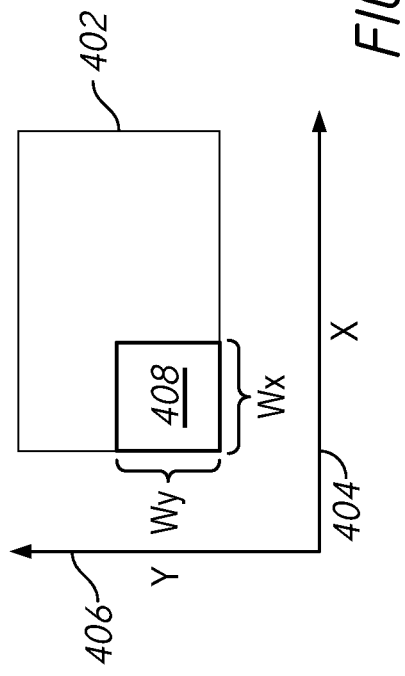
FIG. 4
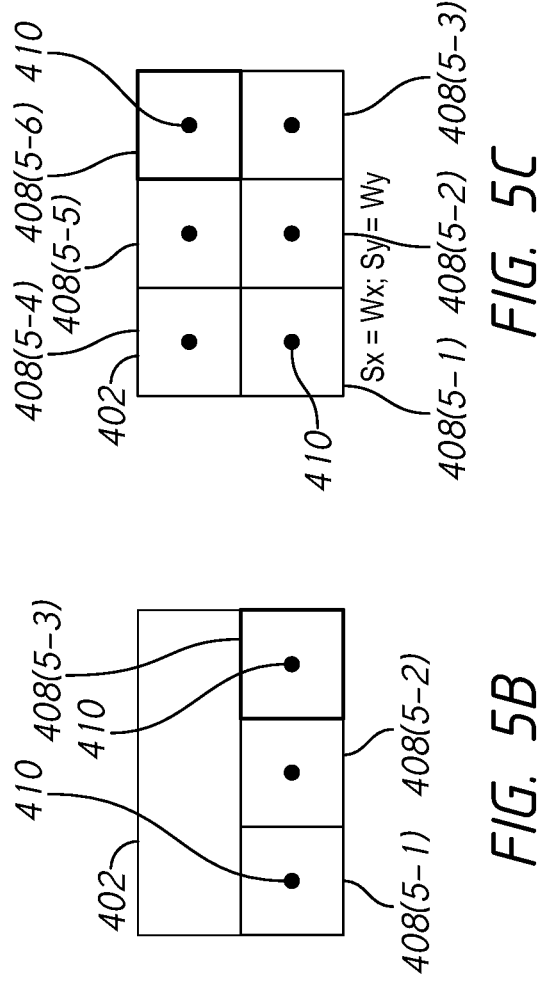
FIG. 5C
FIG. 5B
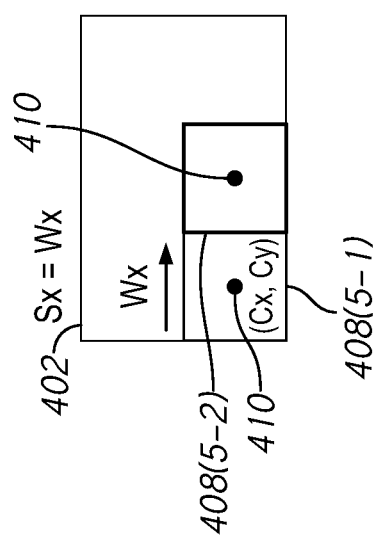
FIG. 5A

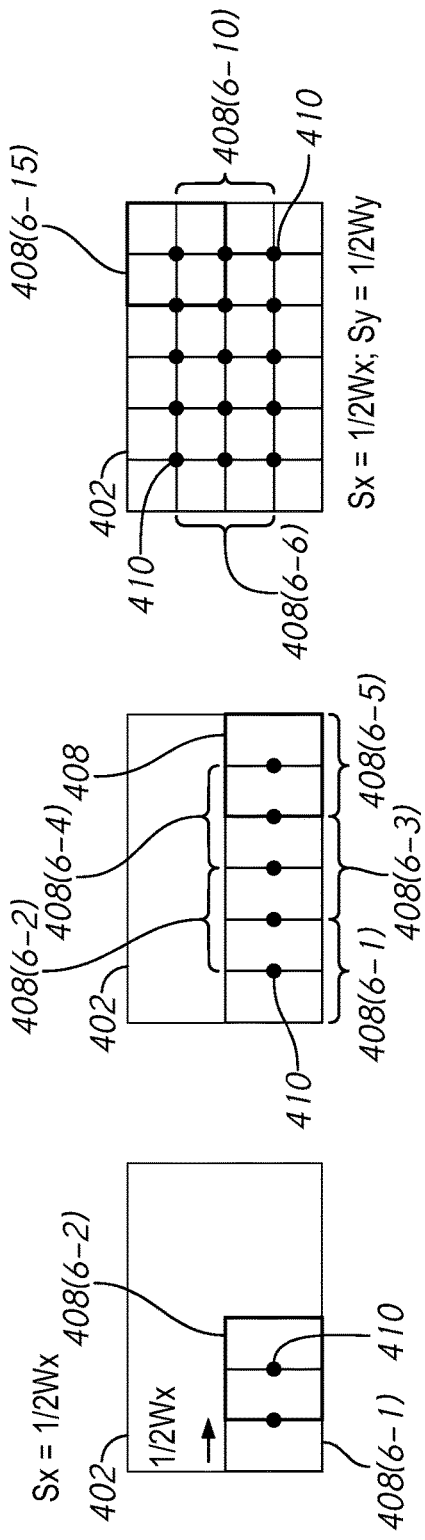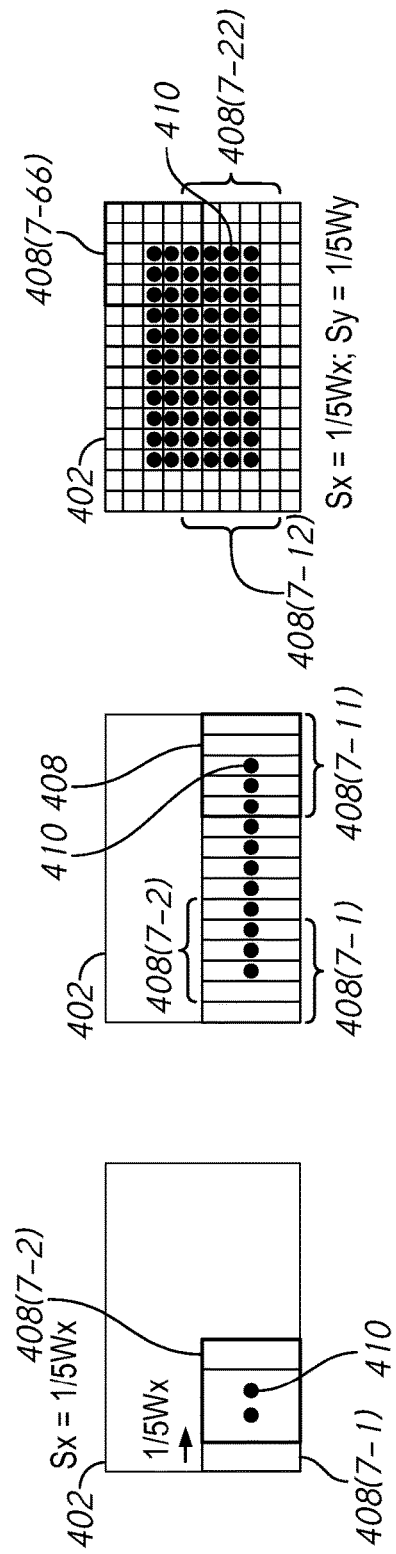

TOPOLOGICAL SIMULATION OF LAYOUT DESIGN

BACKGROUND

High data reliability, high speed memory access, lower power consumption and reduced chip size are features that are demanded from semiconductor devices. To achieve reduced chip size and high data reliability, accurate fabrication of the semiconductor devices has been developed. With miniaturization and multilayer-wiring structure of semiconductor devices, chemical mechanical polishing (CMP) has been introduced. A wafer may have surfaces having a step between different levels upon forming circuit patterns on the wafer. The CMP is a technique to planarize the surfaces on the wafer by the interaction of chemical and mechanical reactions (e.g., physical contact action) on the surfaces, to have the surfaces substantially at the same level. Basic CMP characteristics are based on process conditions (e.g., platen rotation speeds and polishing pressures) material-specific physical properties (e.g., slurries, abrasiveness) of wafers and polishing pads, etc. In the actual CMP processes, the above basic CMP characteristics are also affected by underlying physical shapes of each layout design of wafers, such as pattern densities, dimensions of wirings (e.g., lines), etc. Furthermore, the basic CMP characteristics of each pattern are also affected by the basic CMP characteristics of adjacent patterns.

In recent years, design for manufacturing (DFM) technology has been introduced to improve planarization performance the CMP by suppressing erosion and dishing. Using the DFM, a device pattern shape or a pattern density can be optimized to have suitable basic CMP characteristics for each CMP process. Simulators of layout designs have been introduced to assist checking and optimizing each CMP process by predicting physical parameters of each layout design of wafers after each CMP process. For example, such physical parameters may include a density of a pattern D, a line width Lw, a line space Ls, a line length Lg, a perimeter P around the pattern, a density of the perimeter Pd, etc. In each simulation process, a window size optimized for each process level may be defined on a simulator and the simulator extracts these physical parameters. In a conventional technology, the window size definition is constrained to the resolutions of two dimensions (e.g., X/Y axis) and a step size of each direction is also limited to the resolutions of the two dimensions. To improve accuracy of the simulator, more flexible resolutions and step sizes of windows regardless of window sizes is desired.

BRIEF DESCRIPTION OF THE DRAWINGS

FIG. 3A is a schematic diagram of a pattern of lines of an example layout design.

FIGS. 3B-3E are schematic diagrams of verification areas Va covering the pattern of lines of FIG. 3A with different sizes of windows according to an embodiment of the present disclosure.

FIG. 4 is a schematic diagram of a verification area Va according to an embodiment of the present disclosure.

FIG. 5A-5C are schematic diagrams of the verification area Va according to an embodiment of the present disclosure.

FIG. 6A-6C are schematic diagrams of the verification area Va according to an embodiment of the present disclosure.

FIG. 7A-7C are schematic diagrams of the verification area Va according to an embodiment of the present disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
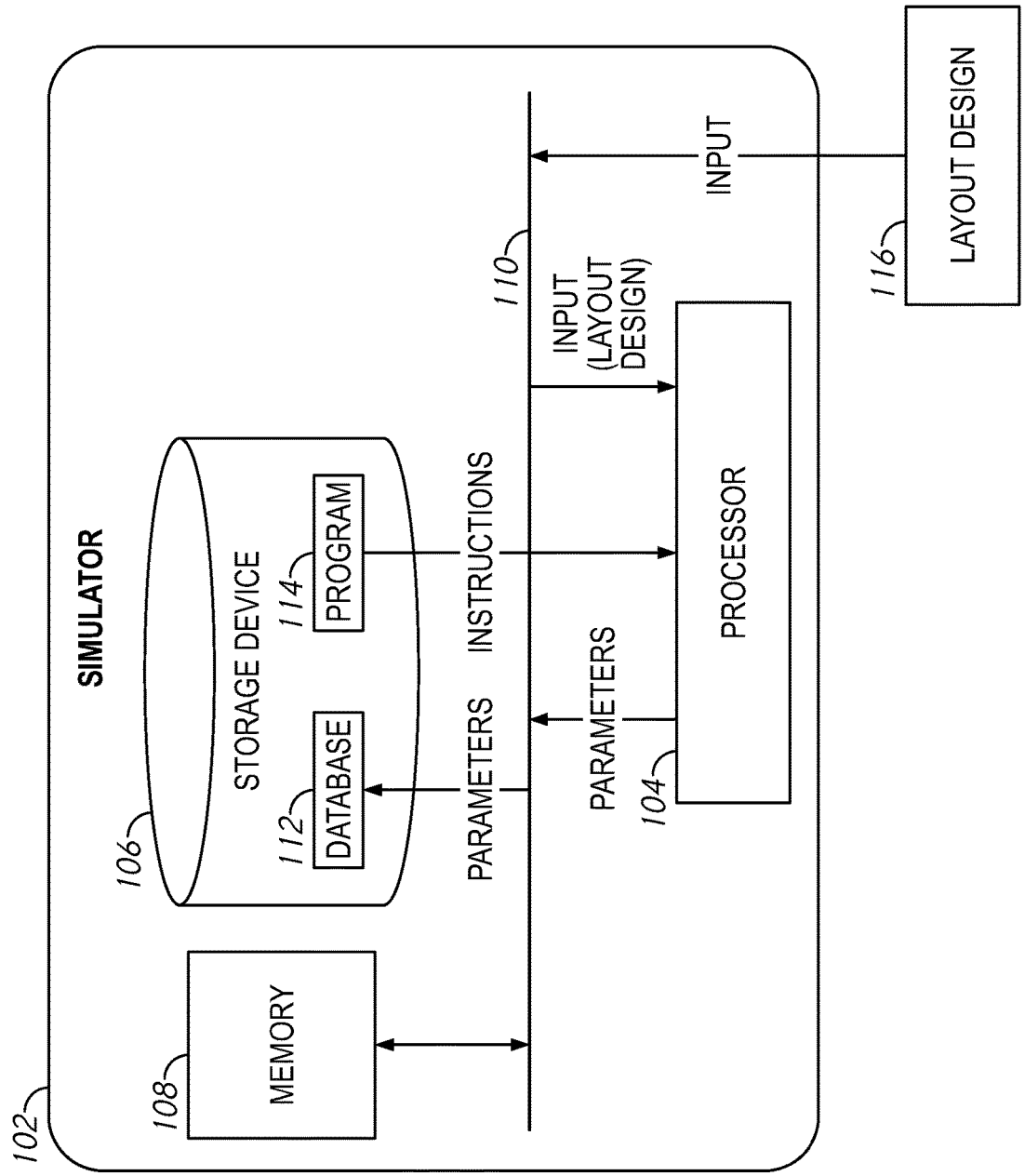
FIG. 1 is a block diagram of a simulator according to an embodiment of the present disclosure.

FIG. 1 is a block diagram of a simulator 102 according to an embodiment of the present disclosure. The simulator 102 includes a processor 104, a storage device 106 and a memory 108. The simulator 102 may further include a bus 110 that transmits information, including communication between devices in the simulator 102, such as the processor 104, the storage device 106 and the memory 108.

The simulator 102 may receive information about a layout design 116. The information about the layout design 116 may include, for example, a circuit layout, rules of lines and layers included in a semiconductor device formed on a wafer as input data. Input data may be provided either online or offline. In some embodiments, the layout design 116 may be provided in a file of a stream format. In case of receiving the input data online, the simulator 102 may further include a transmitter-receiver that performs communication, including transmission and reception of data, via a network, such as the Internet, over wired communications (e.g., a universal serial bus, an ether cable, etc.), a wireless fidelity (Wi-Fi) network, a cellular network, etc. Alternatively, the simulator 102 may include a media drive that may receive the input data from a medium installed in the media drive. The input data may be provided to the processor 104 through the bus 110. In some embodiments, the processor 104 may be a central processing unit (CPU) that performs various kinds of computations and controls. Furthermore, if the simulator 102 includes a graphics processing unit (GPU), a part of the various computations and controls may be performed by the GPU. The simulator 102 may be implemented as a computer, for example, a network computer such as a server, a personal computer, or a dedicated computer. The simulator 102 may appropriately perform, by the processor 104, various kinds of information processing to simulate a shape of a surface of a wafer after a chemical mechanical polishing (CMP) process based on a layout design, such as a layout design of a semiconductor device. For example, the simulator 102 may simulate topological features of the shape of the surface of the wafer, which may include a height between a highest position and a lowest position of the surface. To perform information processing, the processor 104 may temporarily store data on the memory 108 and obtain processing results using the information about the layout design as well as physical and chemical characteristics of the CMP process. After obtaining the processing results, including the topological features, the processor 104 may store the processing results in the storage device 106.

The storage device 106 may function as a storage medium for storing various kinds of information. A configuration of the storage device 106 is not limited particularly. In some embodiments, the storage device 106 may store, for example, a program 114 that is run by the processor 104, and a database 112 that stores the processing results in a meaningful manner for future use. In some embodiments, the program 114 and/or the database 112 may be in a form of one or more files. The files may be in a binary format or a text format. In some embodiments, separate storage devices or separate regions in each device may be provided for the program 114 and the database 112. For example, the storage device 106 may include a hard disk drive (HDD) and a solid state drive (SSD). The processor 104 in the simulator 102 may execute the various kinds of processing described above in accordance with various kinds of control programs (for example, a wafer surface topology simulation program) stored in the storage device 106.

Figure 2:
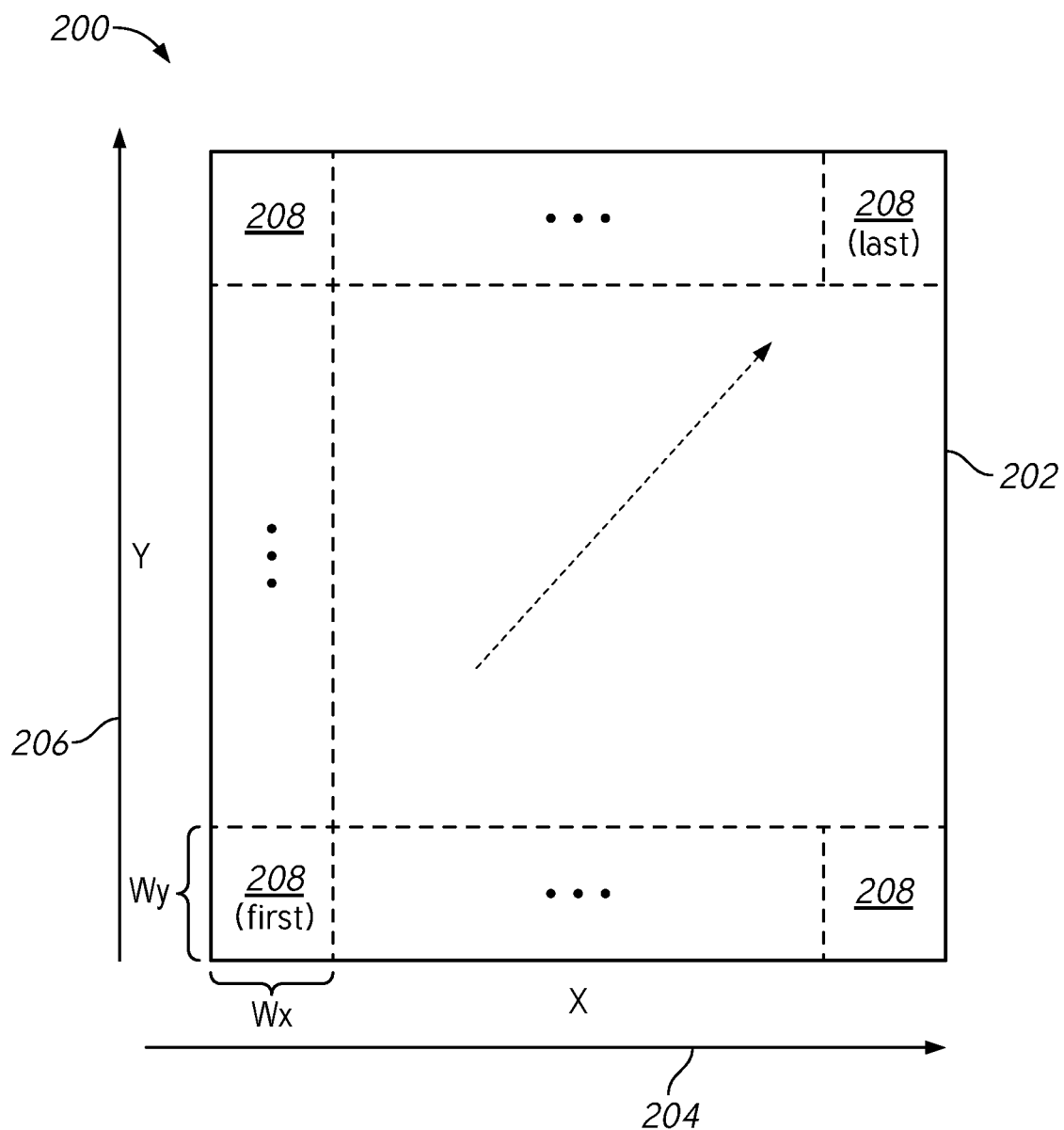
FIG. 2 is a schematic diagram of a verification area Va for a simulator according to an embodiment of the present disclosure.

FIG. 2 is a schematic diagram of a verification area Va 202 for a simulator according to an embodiment of the present disclosure. The information about the layout design covered by the verification area Va may be obtained using one or more windows 208. The one or more windows 208 may have a size that may be defined by the simulator 102. For example, once the simulator 102 receives the information about the layout design (e.g., the layout design 116), the processor 104 in the simulator 102 may define the size of a window 208 in the verification area Va 202 based on the layout design. The processor 104 of the simulator 102 may perform the simulation process for the layout design. The window 208 is a unit of an area in the verification area Va 202 that the simulator 102 may use to extract information for a portion of a layout design, including a circuit layout, rules of lines and layers. In some embodiments, the window size may be defined as a width Wx of the window 208 in one direction (e.g., X direction 204) and a height Wy of the window 208 in another direction (e.g., Y direction 206). In some embodiments, the X direction 204 and Y direction 206 may be perpendicular to each other. In some embodiments, the width Wx and the height Wy of the window 208 may be equal (Wx=Wy). In some embodiments, the width Wx and the height Wy of the window 208 may be different. (Wx≠Wy).

Information about the layout design may be extracted for the entire verification area Va 202 using one or more windows 208. The one or more windows 208 cover the verification area Va 202. For example, in some embodiments, one or more windows are shifted over the verification area Va. Information about the layout design can be obtained at every location of the one or more windows 208 in the verification area Va. The one or more windows may be shifted by a step size that is less than the window size (e.g., less than the width Wx in one direction (e.g., X direction 204) and/or less than the height Wy of the window 208 in the other direction (e.g., Y direction 206). Extraction of information about the layout design from each window 208 may be performed in one direction (e.g., X direction 204) and then in the other direction (e.g., Y direction 206). A number of the one or more windows 208 in the one direction (e.g., X direction 204) is greater than a width of the verification area Va divided by the width of each window Wx. A number of the one or more windows 208 in the other direction (e.g., Y direction 206) is greater than a number that is a length of the verification area Va divided by the length of each window Wy. In some embodiments, the first window 208 and the last window 208 may be at ends of a diagonal of the verification area Va 202.

In some embodiments, the window size may be carefully defined for the layout design in a wafer 200 for which the simulation process is performed. FIG. 3A is a schematic diagram of an example pattern of lines of an example layout design. An area 302 includes lines, where each line has a line width Lw(a). The area 302 may include a line space Ls(a) between the adjacent lines of the lines in the area 302. An area 304 includes lines, where each line has a line width Lw(b). The area 304 may include a line space Ls(b) between the adjacent lines of the lines in the area 304. In the example of FIG. 3A, the line width Lw(a) and the line space Ls(a) are the same (Lw(a)=Ls(a)), and the line width Lw(b) and the line space Ls(b) are the same (Lw(b)=Ls(b)). In this example, the line width Lw(b) is half of the line width Lw(a), (Lw(b)=Lw(a)/2) and the line space Ls(b) is about half of the line space Ls(a), (Ls(b)=Ls(a)/2). A verification area Va may cover the lines of the area 302 and 304.

As previously described, the size of a window of a verification area Va may be based on a layout design. FIGS. 3B-3E are schematic diagram of verification areas Va 306, 308, 310 and 312 covering the pattern of lines of FIG. 3A with different sizes of windows according to an embodiment of the present disclosure.

The verification area Va 306 of FIG. 3B includes windows where a width Wx of each window is about half of the line width of lines in the area 302 (e.g., Wx=Lw(a)/2=Ls(a)/2=Lw(b)=Ls(b)) (e.g., "Condition I"). Here, each window may have a density of one or more patterns (e.g., a pattern density D) that is either 100% or 0%. The pattern densities from this condition may not provide gradual changes of pattern densities, even if such changes exist. Furthermore, a line width or a line space may not be extracted by analyzing each window alone since the width Wx of each window is smaller than the line width Lw(a) and the line space Ls(a). Thus, the width Wx under Condition I may be too small and may not be suitable for the verification area 306.

The verification area Va 308 of FIG. 3C includes windows where a width Wx of each window is about the line width or line space of lines in the area 302 (e.g., Wx=Lw(a)=Ls(a)=Lw(b)+Ls(b)) (e.g., "Condition II"). Here, in the area 302, each window may have a pattern density that is either 100% or 0%. On the other hand, in the area 304, each window may have a pattern density between 100% and 0%, for example, 50%. Thus, more changes in the pattern densities may be obtained. However, because a line width or a line space in the area 302 may be greater than the window width Wx, the line width Lw(a) or the line space Ls(a) in the area 302 may not be extracted by analyzing each window alone. Furthermore, since a sum of the line width Lw(b) and the line space Lw(b) is equal to the width Wx of each window, the line width Lw(b) and the line space Ls(b) may not be extracted. Similarly, in the verification area Va 310 of FIG. 3D including windows where a width Wx of each window is about a sum of the line width and the line space of lines in the area 302 (e.g., Wx=Lw(a)+Ls(a)) (e.g., "Condition III"), the line width Lw(a) and the line space Ls(a) may not be extracted.

The verification area Va 312 of FIG. 3E includes windows where a width Wx of each window is about a sum of the one and half line width and the line space of lines in the area 302 (e.g., Wx=Lw(a)+Ls(a)+Lw(a)/2) (e.g., "Condition IV"). Here, in the areas 302 and 304, some windows may have a pattern density that is 60% and the other windows may have another pattern density that is 40%. Thus, more variation in the pattern densities may be obtained. The line space Ls(a) may be obtained from the left most window of in the area 302, and the line width Lw(a) may be obtained from the right most window in the area 302. The line width Lw(b) and the line space Ls(b) may be obtained from any window in the area 304.

The above combinations of the line patterns, windows, areas 302 and 304, and verification area Va 306, 308, 310 and 312 are merely examples. In general, a reasonably large window size (e.g., a window width Wx and a window height Wy) is likely to help in extracting size information, such as line widths Lw and line spaces Ls in X direction (e.g., X direction 204), line lengths Lg in Y direction (e.g., Y direction 206), and perimeters P of one or more patterns in each window accurately.

FIG. 4 is a schematic diagram of a verification area Va 402 according to an embodiment of the present disclosure. After defining the window size, the processor 104 in the simulator 102 may define window step sizes in a plurality of directions (e.g., X direction 404 and Y direction 406). In some embodiments, the window step sizes $S_x$ and $S_y$ may be defined for respective step directions (e.g., X direction 404 and Y direction 406) of each window 408 (e.g., the window 208) in the verification area Va 402, respectively. In some embodiments, the window step sizes Sx and Sy may be defined independently from the window width and length Wx and Wy. In some embodiments, the window step size Sx in X direction 404 and the window step size Sy in Y direction 406 of the window 408 may be equal (Sx=Sy). In some embodiments, the window step sizes Sx and Sy of the window 408 may be different (Sx≠Sy).

FIGS. 5A-5C, 6A-6C and 7A-7C are schematic diagrams of the verification area Va 402 according to embodiments of the present disclosure. FIGS. 5A-5C, FIGS. 6A-6C and FIGS. 7A-7C show different window step sizes Sx and Sy may be defined for window 408 by the processor 104. Each location of the window 408 may be identified by a central point 410. The central points 410 of the windows 408 may be represented by coordinates (Cx, Cy) in X direction 404 and Y direction 406.

In some embodiments, the verification area Va 402 of FIGS. 5A-5C has a window step size Sx that is a distance between the central points 410 of adjacent windows 408 in X direction 404. That is, the window step size Sx may be equal to the width Wx of the window 408.

In some embodiments, information for windows 408 may be extracted in a sequential order. Information about a layout design includes, for example, topological parameters. Examples of topological parameters include size related topological parameters and other types of topological parameters. Examples of size related topological parameters includes line widths Lw, line spaces Ls, line lengths Lg, and perimeters. An example of another type of topological parameter are densities, for example, pattern densities D, perimeter densities Pd, and the like. After extracting the information, the windows 408 may be shifted by at least one of the first and second step sizes to a plurality of window locations in the verification area. In FIG. 5A, after extracting the information in the window 408 on a left side of the verification area Va 402 (e.g., window 408(5-1)), the window 408 is shifted by the window step size Sx that is the width Wx in X direction 404, to reach next window 408 (e.g., window 408(5-2)). After extracting the information for the window 408(5-2), the window 408 may be shifted again in the verification area Va 402 by the window step size Sx in X direction 404 that results in yet another window 408 to the right side of the verification area Va 402 (e.g., window 408(5-3)). After extracting information about the layout design for the window 408(5-3) at the right side of the verification area Va 402, information about the layout design for three adjacent windows 408 in X direction 404 in the verification area Va 402 as shown in FIG. 5B has been extracted.

After extracting information about the layout design for the windows 408(5-1)-408(5-3) in the X direction, the window 408 may be shifted in Y direction. In some embodiments, the window 408 may be shifted to the left side of the verification area Va 402 and also shifted in Y direction 406 by the window step size Sy that is the height Wy in Y direction 404 (e.g., window 408(5-4) in FIG. 5C). After extracting information about the layout design for the window 408(5-4) at the top left of the verification area Va 402, the window 408 may be shifted in X direction (e.g., window 408(5-5)). The extraction of the information and shifting the window 408 in X direction are repeated until reaching to the right side of the verification area 402 as shown in FIG. 5C (e.g., window 408(5-6)).

In some embodiments, the sequence of shifting the window 408 in the verification area Va 402 is different than for the previously described example. For example, the window 408 may be shifted in Y direction 406 by the window step size Sy that is the height Wy in Y direction 404 to reach a window 408 along the right side of the verification area Va 402 (e.g., window 408(5-6)). After extracting information about the layout design for the window 408(5-6) at the top right of the verification area Va 402 as shown in FIG. 5C, the window 408 may be shifted in a direction opposite to X direction (e.g., window 408(5-5)) and the extraction of the information and shifting the window 408 in the direction opposite to X direction are repeated until reaching to the left side of the verification area 402 (e.g., window 408(5-4)).

In other embodiments, multiple windows 408 may be used to extract the information about the layout design from the verification area Va. For example, in some embodiments, the information may be extracted concurrently from multiple windows 408 in a row (e.g., windows 408(5-1)-408(5-3)) and the multiple windows 408 may be shifted in Y direction. Or the information may be extracted concurrently from multiple windows 408 in a column and the windows 408 may be shifted in X direction. Alternatively, the information may be extracted from all windows 408 concurrently.

By shifting the window 408 in the verification area Va 402 by a window step size Sy that is equal to the height Wy of the window 408 in Y direction 406, the information about the layout design included in the verification area Va may be extracted as shown in FIG. 5C. The distance between central points 410 of the two adjacent windows 408 in Y direction 404 may be equal to the height Wy of the window 408. As a result, the number of central points 410 in the verification area Va 402 is equal to the number of different locations for window 408 in the verification area Va 402, which in the example of FIGS. 5A-5C, may be six.

A database (e.g., the database 112) may store the extracted information for each window 408 in association with the coordinates (Cx, Cy) of the central points 410 of the window 408. For example, with reference to the example of FIGS. 5A-5C, a number of entries stored in the database in association with the coordinates (Cx, Cy) of the central points 410 may be six. In some embodiments, topological features of a shape of a surface of the verification area (e.g., a height between a highest position and a lowest position of the surface) may be computed based on the extracted information about the layout design for the one or more window 408.

In some embodiments, the window step size Sx in X direction 404 may be configured to be less than the width Wx of the window 408 in X direction 404, and the window step size Sy in Y direction 406 may be less than the height Wy of the window 408 in Y direction 406.

For example, the verification area Va 402 of FIGS. 6A-6C have a window step size Sx that is equal to the half width (=½Wx) of the window 408 between adjacent windows 408 in X direction 404. In some embodiments, a window 408 on a left side of the verification area Va 402 in FIG. 6A (e.g., window 408(6-1)) may be shifted by the window step size Sx equal to the half width (=½Wx) of the window 408 in X direction 404 to a next window 408 (e.g., window 408(6-2)), after information about a layout design may be extracted for the window 408(6-1). The next window 408(6-2) may have a central point 410 on the right side of the previous window 408(6-1) before shifting. The extraction of the information and shifting the window 408 in X direction are repeated until reaching to the right side of the verification area 402 (e.g., the window 408(6-5)). After extracting information about the layout design for the window 408(6-5) at the right side of the verification area Va 402, the information about the layout design for five adjacent windows 408(6-1)-408(6-5) in X direction 404 in the verification area Va 402 as shown in FIG. 6B has been be extracted.

After extracting information about the layout design for the windows 408 in X direction, the window 408 may be shifted in Y direction. In some embodiments, the window 408 may be shifted to the left side of the verification area Va 402 and also shifted in Y direction 406 by the window step size Sy that is the half-height (=½Wy) in Y direction 404 (e.g., window 408(6-6) in FIG. 6C. After extracting information about the layout design for the window 408(6-6) on the left side of the verification area Va 402, the window 408 may be shifted in X direction. The extraction of the information and shifting the window 408 in X direction and Y direction are repeated until reaching to the top right corner of the verification area 402 as shown in FIG. 6C (e.g., window 408(6-15)).

In some embodiments, the window 408 may be shifted in Y direction 406 by the window step size Sy that is the half-height (=½Wy) in Y direction 404 to reach a next window (e.g., window 408(6-10)) along the right side of the verification area Va 402. After extracting information about the layout design for the next window 408, the window 408(6-10) may be shifted in a direction opposite to X direction (the "reverse-X direction") by the half-width (=½Wx). The extraction of the information and shifting the window 408 in the reverse-X direction by the half-width (=½Wx) are repeated until reaching to the left side of the verification area 402. The extraction of the information and shifting the window 408 in X direction or reverse-X direction in an alternating manner and Y direction are repeated until reaching to the top right corner of the verification area 402 as shown in FIG. 6C.

In other embodiments, the information may be extracted concurrently from windows 408 in a row and the windows 408 may be shifted in Y direction. In some embodiments, the information may be extracted concurrently from windows 408 in a column and the windows 408 may be shifted in X direction. Alternatively, the information may be extracted from all windows 408 concurrently.

By shifting the window 408 in the verification area Va 402 by a window step size Sy that is equal to the half-height (=½Wy) of the window 408 in Y direction 406, the information about the layout design included in the verification area Va may be extracted as shown in FIG. 6C. The distance between adjacent central points 410 of the two adjacent window locations of the windows 408 in Y direction 404 may be equal to the half-height (=½Wy) of the window 408. As a result, the number of central points 410 in the verification area Va 402 is equal to the number of windows 408 in the verification area Va 402, which in the example of FIGS. 6A-6C, may be fifteen. In comparison to the example of FIGS. 5A-5C, which included six central points 410, the number of central points 410 in the example of FIGS. 6A-6C is greater.

A database (e.g., the database 112) may store the computed topological information for each window 408 in association with the coordinates (Cx, Cy) of the central points 410 of the window 408. For example, with reference to the example of FIGS. 6A-6C, a number of entries stored in the database in association with the coordinates (Cx, Cy) of the central points 410 may be fifteen. In some embodiments, topological features of a shape of a surface of the verification area (e.g., a height between a highest position and a lowest position of the surface) may be computed based on the extracted information about the layout design for the one or more window 408.

In some embodiments, the verification area Va 402 of FIGS. 7A-7C have a window step size Sx that is equal to the 20% width (=⅕Wx) of the window 408 between adjacent windows 408 in X direction 404. In some embodiments, a window 408 on a left side of the verification area Va 402 in FIG. 7A (e.g., window 408(7-1)) may be shifted by the window step size Sx equal to the 20% width (=⅕Wx) of the window 408 in X direction 404 to a next window 408 (e.g., window 408(7-2)), after information about a layout design may be extracted for the window 408(7-1). The next window 408(7-2) may have a central point 410 to the right of the central point 410 of the previous window 408 (7-1) before shifting. The extraction of the information and shifting the window 408 in X direction by 20% width (=⅕Wx) are repeated until reaching to the right side of the verification area 402 (e.g., the window 408(7-11). After extracting information about the layout design for the window 408 at the right side of the verification area Va 402, the information about the layout design for eleven adjacent windows 408 (7-1)-408(7-11) in X direction 404 in the verification area Va 402 as shown in FIG. 7B may be extracted.

After extracting information about the layout design for the windows 408 in X direction, the window 408 may be shifted in Y direction. In some embodiments, the window 408 may be shifted to the left side of the verification area Va 402 and also shifted in Y direction 406 by the window step size Sy that is the 20% height (=⅕Wy) in Y direction 404 (e.g., window 408(7-12) in FIG. 7C). After extracting information about the layout design for the window 408(7-12) on the left side of the verification area Va 402, the window 408 may be shifted in X direction by 20% width (=⅕Wx). The extraction of the information and shifting the window 408 in X direction and Y direction are repeated until reaching to the top right corner of the verification area 402 as shown in FIG. 7C (e.g., window 408(7-66)).

In some embodiments, the window 408 may be shifted in Y direction 406 by the window step size Sy that is the 20% height (=⅕Wy) in Y direction 404 to reach a next window (e.g., window 408(7-22)) along the right side of the verification area Va 402. After extracting information about the layout design for the next window 408, the window 408 may be shifted in the reverse-X direction by 20% width (=⅕Wx). The extraction of the information and shifting the window 408 in the reverse-X direction by 20% width (=⅕Wx) are repeated until reaching to the left side of the verification area 402. The extraction of the information and shifting the window 408 in X direction or reverse-X direction in an alternating manner and Y direction are repeated until reaching to the top right corner of the verification area 402 as shown in FIG. 7C.

In other embodiments, the information may be extracted concurrently from windows 408 in a row and the windows 408 may be shifted in Y direction. In some embodiments, the information may be extracted concurrently from windows 408 in a column and the windows 408 may be shifted in X direction. Alternatively, the information may be extracted from all windows 408 concurrently.

By shifting the window 408 in the verification area Va 402 by a window step size Sy that is equal to the 20% height (=⅕Wy) of the window 408 in Y direction 406, the information about the layout design included in the verification area Va may be extracted as shown in FIG. 7C. The distance between adjacent central points 410 of the two adjacent window locations of the windows 408 in Y direction 404 may be equal to the 20% height (=⅕Wy) of the window 408. As a result, the number of central points 410 in the verification area Va 402 is equal to the number of windows 408 in the verification area Va 402, which is in the example of FIGS. 7A-7C, may be sixty-six (=eleven by six), that is more than fifteen. In comparison to the example of FIGS. 6A-6C, which included fifteen central points 410, the number of central points 410 in the example of FIGS. 7A-7C is greater.

A database (e.g., the database 112) may store the computed topological information for each window 408 in association with the coordinates (Cx, Cy) of the central points 410 of the window 408. For example, with reference to the example of FIGS. 7A-7C, a number of entries stored in the database in association with the coordinates (Cx, Cy) of the central points 410 may be fifty-five. In some embodiments, topological features of a shape of a surface of the verification area (e.g., a height between a highest position and a lowest position of the surface) may be computed based on the extracted information about the layout design for the one or more window 408.

As shown in FIGS. 5A-7C, by providing smaller window step sizes, changes in topological parameters, such as pattern densities D and densities of perimeters of one or more patterns in each window (perimeter densities Pd), across windows may be obtained in a finer resolution, without sacrificing advantages of having a larger window size for accurate extractions of some other topological parameters, such as line widths Lw, line spaces Ls and line lengths Lg.

Figure 8:
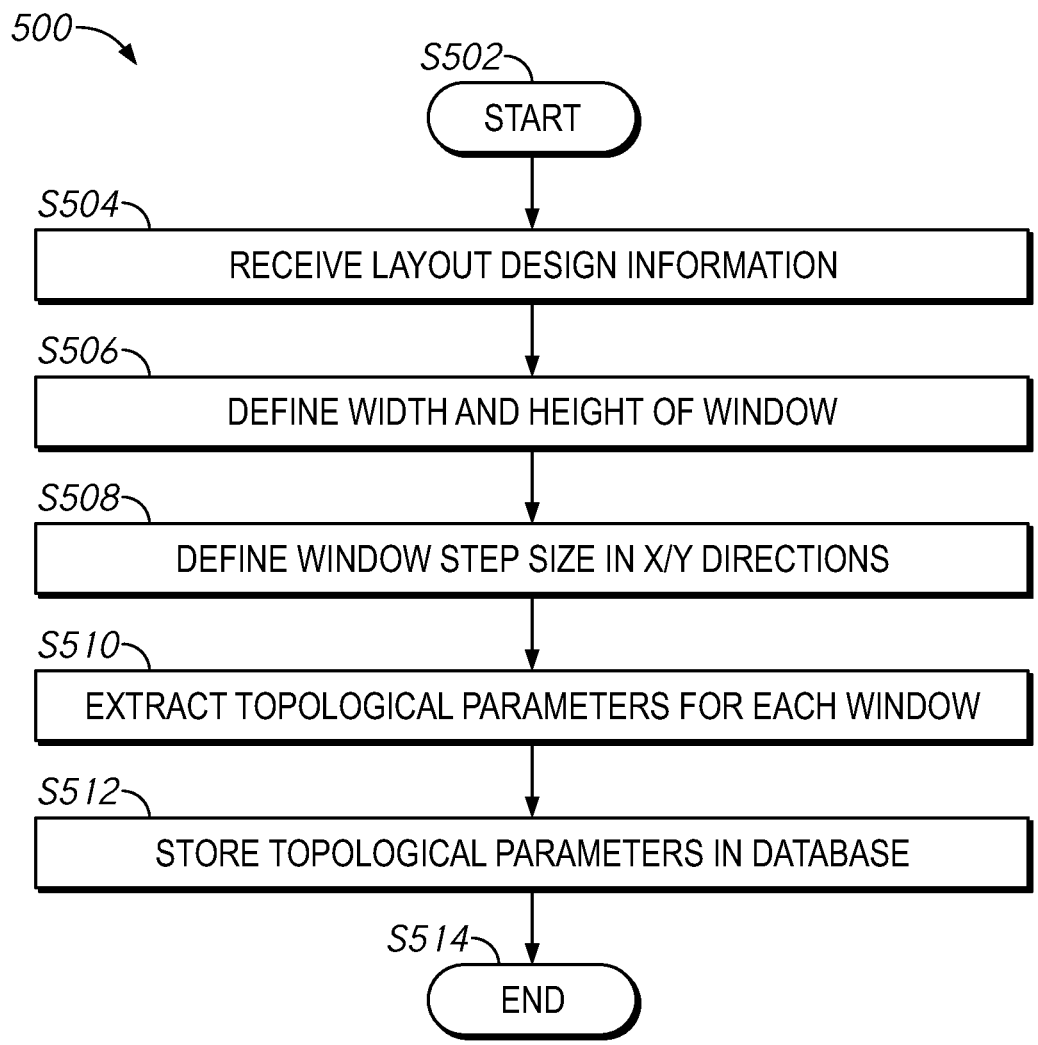
FIG. 8 is a flow diagram of a computer-implemented method including a simulation process according to an embodiment of the present disclosure.

FIG. 8 is a flow diagram 500 of a computer-implemented method including a simulation process according to an embodiment of the present disclosure. Once the simulation process starts (S502), the simulator 102 may receive information about a layout design 116 as input data (S504). In some embodiments, the simulator 102 may receive a file of a stream format including the information about the layout design 116 to be implemented on a wafer. The file including the information about the layout design 116 may be provided online or offline as mentioned earlier referring to FIG. 1.

The processor 104 of the simulator 102 may define a size of one or more windows (S506) in a verification area Va on the wafer where the simulation process is to be performed. For example, the size of the one or more windows may be defined as a width Wx in one direction (e.g., X direction 204 or X direction 404) and a height Wy in another direction (e.g., Y direction 206 or Y direction 406) of the one or more windows. The size of the one or more windows may be selected based on the layout design 116 to assist extracting size related topological parameters (e.g., line widths Lw, line spaces Ls, line lengths Lg and perimeters P) reasonably accurately. For example, the width Wx of the one or more windows may be defined to be larger than a sum of a maximum line width Lw and a maximum line space Ls in a layout design (e.g., the layout design 116).

The processor 104 of the simulator 102 may define a window step size of one or more window (S508) in the verification area Va where the simulation process is to be performed. Window step sizes Sx and Sy of the one or more windows may be defined independently from a size of the one or more windows, such as a width Wx in one direction (e.g., X direction 204 or X direction 404) and a height Wy in another direction (e.g., Y direction 206 or Y direction 406) of the one or more windows. For example, the window step size Sx of the one or more windows may be defined to be less than the width Wx and the window step size Sy of the one or more windows may be defined to be less than the height Wy. Thus, pattern densities D and perimeter densities Pd across windows with a finer resolution may be obtained (e.g., S510) by defining window step sizes Sx and Sy that are smaller than the width Wx and the height Wy of the one or more windows.

Once the window size and the window step sizes are defined, the processor 104 of the simulator 102 may extract information about the layout design 116, such as topological parameters, for each window (S510). The topological parameters extracted may include size related topological parameters (e.g., line widths Lw, line spaces Ls, line lengths Lg and perimeters P) and other topological parameters (e.g., pattern densities D and perimeter densities Pd).

After extracting the topological parameters from each window location in a verification area Va (e.g., for each central point 410), the extracted topological parameters may be stored in the database 112 (S512). In some embodiments, the topological parameters for each window location may be stored in association with coordinates of the center of each window (e.g., central point 410). In some embodiments, the processor 104 may extract the topological parameters and store the parameters temporarily in the memory 108 for a plurality of windows (S510). The processor 104 may later move the temporarily stored topological parameters in association with the coordinates of the centers of the plurality of windows in the database 112 in the storage device 106 in a batch (S512). In other embodiments, the processor 104 may extract and store the topological parameters for each window location temporarily in the memory 108 during the extraction of the topological parameters, and immediately store the topological parameters of each window location in association with the coordinates of the center of each window in the database 112 (S512). In such embodiments, the sequence of S510 and S511 is repeated for each of the plurality of window locations. The database 112 may be stored in the storage device 106 as one or more files. The one or more files may be in a binary format or a text format. The database 112 may be used for various analyses by users. For example, the database 112 may be used for improvement of CMP processes.

As described above, a step size of each window in each direction may be defined independently from a size of the window, such as a window width and a window height. By flexible definition of window step sizes in corresponding dimensions, changes in pattern densities may be simulated with a resolution reasonably higher than a resolution resulted from a window step size fixed to the window width or the window height. Because the simulation may be performed without having its resolution bound to window sizes, the flexible definition of window step sizes may provide more accurate simulation results. While obtaining density changes in the fine resolution by smaller window step sizes, a relatively large window size defined by a width and a height of each window may be maintained. Thus an advantage of accurately extracting line widths, line spaces, line length, perimeters, etc. by relatively large windows may be maintained.

The above simulation process with flexible resolutions obtained by flexible window step sizes may be applied to simulations of fabrication processes of either metal or non-metal components in semiconductor layout designs, such as extraction of topological parameters and computation of topological features by CMP simulators. Furthermore, the above simulation process with flexible resolutions of layout designs may be applied to calculations for physical contact polishing, not necessarily related to semiconductor layout designs.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. A computer-implemented method for simulating topological features of a layout design, the method comprising:
   receiving information about the layout design in a verification area, the information about the layout design including one or more topological parameters;
   defining a width in a first direction and a length in a second direction of one or more windows in the verification area;
   defining a first step size independently from the width in the first direction for the one or more windows, the first step size being a distance between adjacent central points of the one or more windows in the first direction;
   defining a second step size independently from the length in the second direction for the one or more windows, the second step size being a distance between adjacent central points of the one or more windows in the second direction;
   extracting information about the layout design in the one or more windows at each of a plurality of window locations for the entire verification area; and
   storing the information about the layout design for the one or more windows at each of the plurality of window locations in a database.

2. The computer-implemented method of claim 1, wherein the information extracted about the layout design for the one or more windows at each of the plurality of window locations comprises at least one of:
   a line width of at least one line in each window;
   a line length of at least one line in each window;
   a line space of at least one line space between adjacent lines in each window;
   a density of one or more patterns in each window;
   a perimeter of the one or more patterns in each window; or
   a density of the perimeter in each window.

3. The computer-implemented method of claim 1, further comprising:
   shifting the one or more windows by at least one of the first and second step sizes to a plurality of window locations in the verification area.

4. The computer-implemented method of claim 1, wherein the information extracted about the layout design for the one or more windows at each of the plurality of window locations is stored in the database in association with coordinates of a central point of each window at each of the plurality of window locations.

5. The computer-implemented method of claim 4, further comprising simulating at least one height between a highest position and a lowest position of a surface in the verification area as a topological feature based on the extracted information for the plurality of windows in the verification area stored in the database.

6. The computer-implemented method of claim 1, wherein defining the first step size independently from the width comprises defining the first step size different from the width, and
   wherein defining the second step size independently from the length comprises defining the second step size different from the length.

7. The computer-implemented method of claim 6, wherein the first step size is less than the width.

8. The computer-implemented method of claim 6, wherein the second step size is less than the length.

9. The computer-implemented method of claim 1, wherein the one or more windows are configured to cover the verification area.

10. The computer-implemented method of claim 2, wherein a number of the one or more windows in the first direction is greater than a number that is a width of the verification area divided by the width of each window, and
    wherein a number of the one or more windows in the second direction is greater than a number that is a length of the verification area divided by the length of each window.

11. The computer-implemented method of claim 1, wherein defining the width and the length is responsive to the layout design.

12. The computer-implemented method of claim 11, wherein the width is larger than a sum of a maximum line width of at least one line in the window and a maximum line space of at least one line space between adjacent two lines in the window.

13. An apparatus for simulating topological features of a layout design, the apparatus comprising:
    an input device configured to receive information about the layout design in a verification area;
    one or more processors configured to:
       define a width in a first direction and a length in a second direction of one or more windows in the verification area;
       define a first step size independently from the width in the first direction for the one or more windows, the first step size being a distance between adjacent central points of the one or more windows in the first direction;

define a second step size independently from the length in the second direction for the one or more windows, the second step size being a distance between adjacent central points of the one or more windows in the second direction; and extract information about the layout design in the one or more windows at each of a plurality of window locations for the entire verification area; and a storage device comprising a database configured to store the information about the layout design for the one or more windows at each of the plurality of window locations.

14. The apparatus of claim 13, wherein the information extracted about the layout design for the one or more windows at each of the plurality of window locations comprises at least one of:
a line width of at least one line in each window;
a line length of at least one line in each window;
a line space of at least one line space between adjacent lines in each window;
a density of one or more patterns in each window;
a perimeter of the one or more patterns in each window; or
a density of the perimeter in each window.

15. The apparatus of claim 13, wherein the one or more processors are further configured to shift the one or more windows by at least one of the first and second step sizes to a plurality of window locations in the verification area.

16. The apparatus of claim 13, wherein the database is configured to store the information extracted about the layout design for the one or more windows at each of the plurality of window locations in association with coordinates of a central point of each window at each of the plurality of window locations.

17. The apparatus of claim 16, wherein the one or more processors are configured to simulate at least one height between a highest position and a lowest position of a surface in the verification area as a topological feature based on the extracted information for the plurality of windows in the verification area stored in the database.

18. The apparatus of claim 13, wherein the first step size is different from the width and the second step size is different from the length.

19. The apparatus of claim 18, wherein the first step size is less than the width and the second step size is less than the length.

20. The apparatus of claim 13, wherein the one or more windows are configured to cover the verification area.

21. The apparatus of claim 20, wherein a number of the one or more windows in the first direction is greater than a number that is a width of the verification area divided by the width of each window, and
wherein a number of the one or more windows in the first direction is greater than a number that is a length of the verification area divided by the length of each window.

22. The apparatus of claim 13, wherein the one or more processors are configured to define the width and the length responsive to the layout design.

23. The apparatus of claim 22, wherein the width is larger than a sum of a maximum line width of at least one line in the window and a maximum line space of at least one line space between adjacent two lines in the window.

24. A non-transitory computer-readable medium comprising instructions for simulating topological features of a layout design in a verification area stored thereon, that when executed by one or more processors, cause the one or more processors to perform:
defining a width in a first direction and a length in a second direction of one or more windows in the verification area;
defining a first step size independently from the width in the first direction for the one or more windows, the first step size being a distance between adjacent central points of the one or more windows in the first direction;
defining a second step size independently from the length in the second direction for the one or more windows, the second step size being a distance between adjacent central points of the one or more windows in the second direction;
extracting information about the layout design in the one or more windows at each of a plurality of window locations for the entire verification area; and
storing the information about the layout design for the one or more windows at each of the plurality of window locations in a database.

25. The non-transitory computer-readable medium of claim 24, wherein the information extracted about the layout design for the one or more windows at each of the plurality of window locations comprises at least one of:
a line width of at least one line in each window;
a line length of at least one line in each window;
a line space of at least one line space between adjacent lines in each window;
a density of one or more patterns in each window;
a perimeter of the one or more patterns in each window; or
a density of the perimeter in each window.

26. The non-transitory computer-readable medium of claim 24, wherein the information extracted about the layout design of each window of the plurality of windows is stored in the database in association with coordinates of a central point of each window at each of the plurality of window locations.

27. The non-transitory computer-readable medium of claim 26, further comprising simulating at least one height between a highest position and a lowest position of a surface in the verification area as a topological feature based on the extracted information for the plurality of windows in the verification area stored in the database.

28. The non-transitory computer-readable medium of claim 24, wherein defining the first step size independently from the width comprises defining the first step size different from the width, and
wherein defining the second step size independently from the length comprises defining the second step size different from the length.

29. The non-transitory computer-readable medium of claim 28, wherein the first step size is less than the width.

30. The non-transitory computer-readable medium of claim 28, wherein the second step size is less than the length.

31. The non-transitory computer-readable medium of claim 24, wherein the one or more windows are configured to cover the verification area.

32. The non-transitory computer-readable medium of claim 31, wherein a number of the one or more windows in the first direction is greater than a number that is a width of the verification area divided by the width of each window, and
wherein a number of the one or more windows in the first direction is greater than a number that is a length of the verification area divided by the length of each window.

33. The non-transitory computer-readable medium of claim 24, wherein defining the width and the length is responsive to the layout design.

34. The non-transitory computer-readable medium of claim 33, wherein the width is larger than a sum of a maximum line width of at least one line in the window and a maximum line space of at least one line space between adjacent two lines in the window.

* * * * *